United States Patent
Kim et al.

(10) Patent No.: US 9,496,143 B2
(45) Date of Patent: Nov. 15, 2016

(54) METAL GATE STRUCTURE FOR MIDGAP SEMICONDUCTOR DEVICE AND METHOD OF MAKING SAME

(71) Applicant: GLOBALFOUNDRIES, Inc., Grand Cayman, KY (US)

(72) Inventors: Hoon Kim, Clifton Park, NY (US); Kisik Choi, Hopewell Junction, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 139 days.

(21) Appl. No.: 13/670,251

(22) Filed: Nov. 6, 2012

(65) Prior Publication Data

US 2014/0124876 A1    May 8, 2014

(51) Int. Cl.
*H01L 21/02* (2006.01)
*H01L 21/8222* (2006.01)
*H01L 21/28* (2006.01)
*H01L 29/49* (2006.01)

(52) U.S. Cl.
CPC ..... *H01L 21/28088* (2013.01); *H01L 29/4966* (2013.01)

(58) Field of Classification Search
CPC .................................................. H01L 21/8238
USPC ................ 257/59, 783, 433, 678, 222, 752; 438/340, 595, 106, 151, 118, 108, 199
See application file for complete search history.

(56) References Cited

U.S. PATENT DOCUMENTS

| | | | |
|---|---|---|---|
| 2005/0059198 A1* | 3/2005 | Visokay et al. | 438/199 |
| 2005/0275035 A1* | 12/2005 | Mathew et al. | 257/369 |
| 2007/0054446 A1* | 3/2007 | Chambers et al. | 438/197 |
| 2008/0272433 A1* | 11/2008 | Alshareef | H01L 21/28088 257/347 |
| 2009/0261424 A1* | 10/2009 | Chang et al. | 257/392 |
| 2009/0294867 A1* | 12/2009 | Lee | H01L 21/28088 257/369 |
| 2010/0327364 A1* | 12/2010 | Tsuchiya | 257/369 |
| 2011/0081774 A1* | 4/2011 | Yeh et al. | 438/591 |
| 2011/0309455 A1* | 12/2011 | Ando | H01L 21/28079 257/410 |
| 2012/0040522 A1* | 2/2012 | Cheng et al. | 438/585 |
| 2013/0026578 A1* | 1/2013 | Tsau | H01L 21/82384 257/368 |
| 2013/0154019 A1* | 6/2013 | Ando et al. | 257/369 |
| 2013/0154021 A1* | 6/2013 | Chuang et al. | 257/369 |

* cited by examiner

*Primary Examiner* — Julio J Maldonado
*Assistant Examiner* — Moin Rahman
(74) *Attorney, Agent, or Firm* — Wayne E. Reinke, Esq.; Heslin Rothenberg Farley & Mesiti P.C.

(57) ABSTRACT

A PFET-based semiconductor gate structure providing a midgap work function for threshold voltage control between that of a NFET and a PFET is created by including an annealed layer of relatively thick TiN to dominate and shift the overall work function down from that of PFET. The structure has a PFET base covered with a high-k dielectric, a layer of annealed TiN, a layer of unannealed TiN, a thin barrier over the unannealed TiN, and n-type metal over the thin barrier.

2 Claims, 2 Drawing Sheets

METAL GATE STRUCTURE FOR MIDGAP SEMICONDUCTOR DEVICE AND METHOD OF MAKING SAME

BACKGROUND OF THE INVENTION

Technical Field

The present invention generally relates to the control of threshold voltage for a semiconductor device and more particularly, the present invention relates to a method of making and gate structure for controlling threshold voltage in a midgap semiconductor device.

Background Information

Where multiple different types of semiconductor devices, such as transistors (e.g., MOSFETs (Metal-Oxide Semiconductor Field-Effect Transistor)), memory and other types are used in the same application, different threshold (i.e., turn-on) voltages (Vth) are needed. For example, SRAM (Static Random Access Memory) typically requires a relatively higher Vth to reduce leakage. As another example, n-type and p-type logic elements typically have relatively low threshold voltages, yet still distinct from each other. Other applications may benefit from a Vth that lies somewhere in between that of the noted n and p-type elements; also referred to as "midgap" devices or elements.

However, the traditional techniques to manipulate Vth have proved troublesome for various reasons. For example, channel doping has been used for transistors to achieve a desired Vth. While this approach works satisfactorily with planar transistors, it is difficult to control the doping level in three-dimensional structures, such as FinFETs, resulting in Vth non-uniformity. Another approach has been to control the thickness of work function or barrier layers. However, threshold voltage control by work function layer thickness or barrier thickness alone is very sensitive to relatively small thickness changes. For example, in p-type field effect transistors (PFETs), the threshold voltage can be controlled by the thickness of the work function layer, such as titanium nitride (TiN).

However, a change of even a few Angstroms of thickness can cause a Vth shift of more than 100 mV. Similarly, in a n-type field effect transistor (NFET), a threshold voltage can be controlled via the thickness of the barrier layer, such as titanium carbide (TiC), tantalum carbide (TaC) or titanium aluminum (TiAl). Similarly, a thickness change of a few Angstroms results in a comparable Vth shift, and it is difficult to precisely control the barrier layer thickness. Thus, a more stable and less sensitive method is needed.

SUMMARY OF THE INVENTION

The shortcomings of the prior art are overcome and additional advantages are provided through the provision, in one aspect, of a method of fabricating a midgap semiconductor device. The method comprises providing a p-type semiconductor device and creating an annealed first work function layer over only the p-type semiconductor device, the first work function layer comprising a transition metal nitride. The method further comprises creating an unannealed second work function layer, also a transition metal nitride, over the annealed first work function layer, creating a barrier layer over the second work-function layer, and creating n-type metal over the barrier layer, the p-type semiconductor device, the annealed first work function layer, the second work function layer, the barrier layer and the n-type metal together forming a midgap semiconductor device, the midgap semiconductor device having a work-function between that of an n-type device and a p-type device.

In accordance with another aspect, a midgap semiconductor device includes a p-type semiconductor device and a layer of annealed first work function material over the p-type semiconductor device, the first work function material comprising a transition metal nitride, a layer of unannealed second work function material, also a transition metal nitride, above the layer of annealed work function material, and a layer of n-type metal above the layer of unannealed work function material.

These, and other objects, features and advantages of this invention will become apparent from the following detailed description of the various aspects of the invention taken in conjunction with the accompanying drawings.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Reference is made below to the drawings, which are not drawn to scale for ease of understanding, wherein the same reference numbers are used throughout different figures designate the same or similar components.

For traditional CMOS devices, n+ polysilicon is used as the electrode for NMOSFET and p+ polysilicon is used for PMOSFET, with an acceptable work function of about 4.1 eV to about 4.4 eV for NFET, and about 4.8 eV to about 5.1 eV for PFET. Between these two work function ranges lies a MOSFET having a midgap value of about 4.6 eV to about 4.7 eV. Such a midgap transistor provides more uniformity in CMOS devices, such as, for example, static random access memory (SRAM). However, to have these three devices with different threshold voltages on the same overall device requires a "cushion" of about 300 mV between NFET and midgap, and between midgap and PFET to reduce the risk of overlap. In other words, a shift "up" from NFET Vth of about 300 mV, and/or a shift "down" from PFET Vth of about the same amount to achieve the noted midgap range. In general, when compared to the work function of NFETs, the same materials used in PFETs, such as, for example, titanium nitride, provide a more stable function that is easier to control. While such materials have proved to have a good band edge work function with good thermal stability for PFET devices (where the band edge work function should be less than 4.9 eV), the work function would still prove to be too high for a midgap device. Therefore, the present invention utilizes annealing of the work function material to lower the work function and the corresponding threshold voltage into the midgap range.

Figure 1:
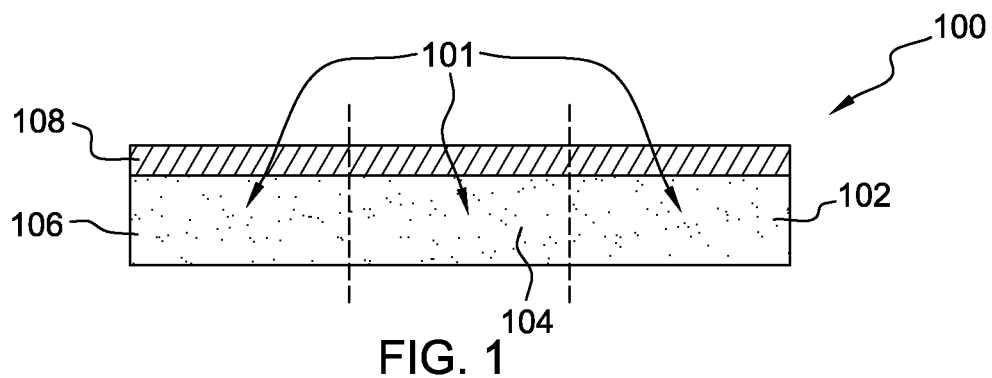
FIGS. 1-4 depict one example of various stages of the fabrication of a midgap semiconductor device based on a p-type semiconductor device according to aspects of the present invention, along with the fabrication of comparative n and p-type devices.

FIG. 1 depicts one simplified example of an intermediate structure, generally denoted 100, obtained during fabrication of a gate stack in a semiconductor device. In this example, a PFET device 102 and NFET device 106 are included with midgap (PFET-based) device 104. However, it will be understood that the midgap end device produced is the focus of the present invention (see FIG. 5). As illustrated, the intermediate structure includes a layer of doped semiconductor material (e.g., silicon) generally denoted 101, that comprises the three transistors. Though omitted for simplification and to focus on the gate structure, it will be understood that each of the three devices has a separate source, channel and a drain. A layer 108 of dielectric material is deposited over the doped silicon, i.e., over the NFET, PFET and midgap devices. Preferably, the dielectric has a high dielectric constant k greater than about 3.9 (k=3.9 for $SiO_2$), and may be deposited by performing a suitable deposition process, such as Atomic Layer Deposition (ALD), Chemical Vapor Deposition (CVD), Physical Vapor Deposition (PVD), or the like. In a specific example, the dielectric material may include a material such as hafnium oxide ($HfO_2$), hafnium silicon oxide ($HfSiO_3$) or hafnium lanthanum oxide (HfLaOx) having a thickness of about 5 Angstroms to about 25 Angstroms.

Figure 2:
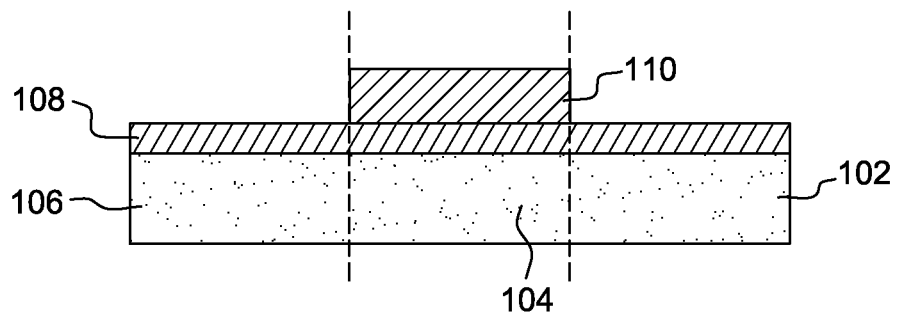

FIG. 2 illustrates a first work function layer 110 over the dielectric layer of midgap device 104. Of course, where the three devices are present, the work function material would initially be deposited over them all, via deposition processes such as ALD, CVD or PVD. However, the Atomic Layer Deposition process is preferred, as this process would achieve very high conformal deposition for three-dimensional devices (e.g., FinFETs) along with better thickness control than the other processes. The work function layer preferably comprises an appropriate transition metal nitride, for example, those from Groups 4-6 in the Periodic Table, including, for example, titanium nitride (TiN), tantalum nitride (TaN), titanium aluminum nitride (TiAlN), tantalum aluminum nitride (TaAlN), niobium nitride (NbN), vanadium nitride (VN), tungsten nitride (WN), and the like with a thickness of about 30 Angstroms to about 60 Angstroms.

The work function layer is then annealed, preferably, at a temperature of about 400° C. to about 700° C., for a desired time to decompose the nitrogen gas created, which causes a downward work function shift of about 300 mV, lowering the work function of the material to about 4.6 eV. Where the work function material is TiN, for example, the loss of nitrogen leaves a titanium-rich film. The length of time for the anneal will depend on the circumstances, for example, the thickness of the work function layer, the technique used and, in particular, the desired threshold voltage. For example, the anneal could be as short as under about a minute using Laser Spike Annealing, or up to about 10 hours under other scenarios. The annealing may be performed using other known techniques, such as Rapid Thermal Anneal and Flash Lamp Anneal. The annealed work function layer is then selectively etched using conventional techniques to remove it from above the NFET and the PFET, leaving a "cap" of annealed work function material over the midgap transistor.

Figure 6:
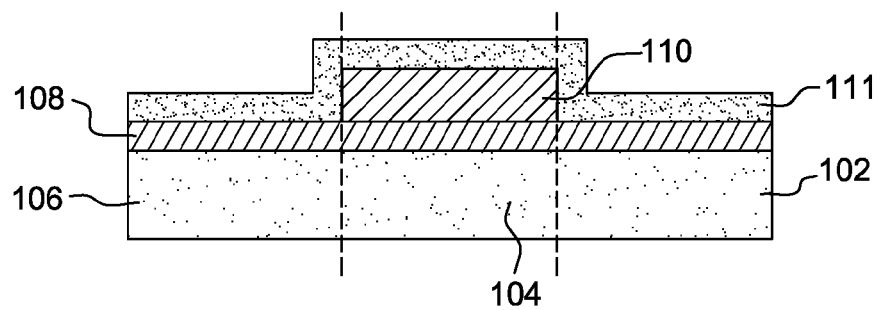
FIG. 6 depicts the gate structure of FIG. 2 with an added layer of polysilicon.

Optionally, a layer of amorphous silicon or polysilicon 111 in FIG. 6, having a thickness of about 20 Angstroms to about 400 Angstroms, may be formed over the first work function layer 110 prior to annealing using, for example, a chemical vapor deposition process. The polysilicon layer acts as an oxygen barrier during annealing. After annealing, the silicon layer is removed using conventional techniques, for example, an etching agent having ammonia containing chemistry without touching the underlying first work function layer.

Figure 3:
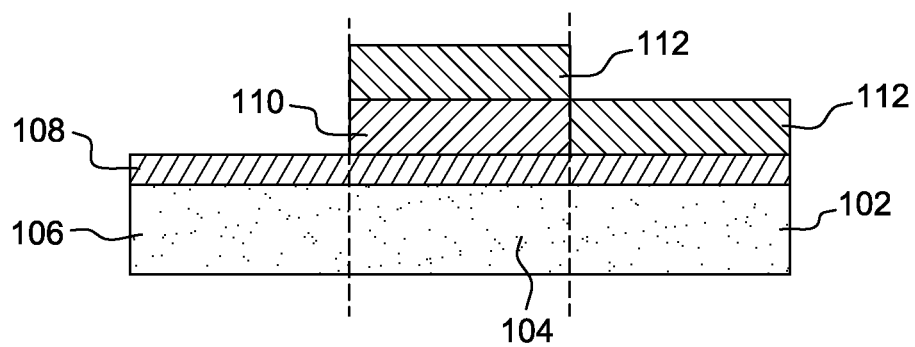

FIG. 3 illustrates deposition of a second work function layer 112 over the exposed dielectric layer 108 above the NFET and the PFET, and above the annealed work function layer 110. A conventional deposition process, such as ALD, CVD, PVD or the like may be used, although an atomic layer deposition is preferred. The thickness of the second work function layer, preferably a transition metal nitride, may be about 20 Angstroms to about 50 Angstroms. As noted, the second work function layer is also preferably an appropriate transition metal nitride, for example, those from Groups 4-6 in the Periodic Table, which include, for example, TiN, TaN, TiAlN, TaAlN, NbN, VN and WN. The second work function layer is selectively etched to remove a portion of the second work function layer from above the NFET and expose the underlying dielectric layer. The addition of the second work function layer, which is not annealed, increases the work function of the p-type device 102 to about 4.9 eV. Note that the work function of the midgap device is largely determined by the annealed work function layer 110, due to its relative thickness, such that the effect of other work function layers, including those that may otherwise tend to increase the work function, is minimized.

Figure 4:
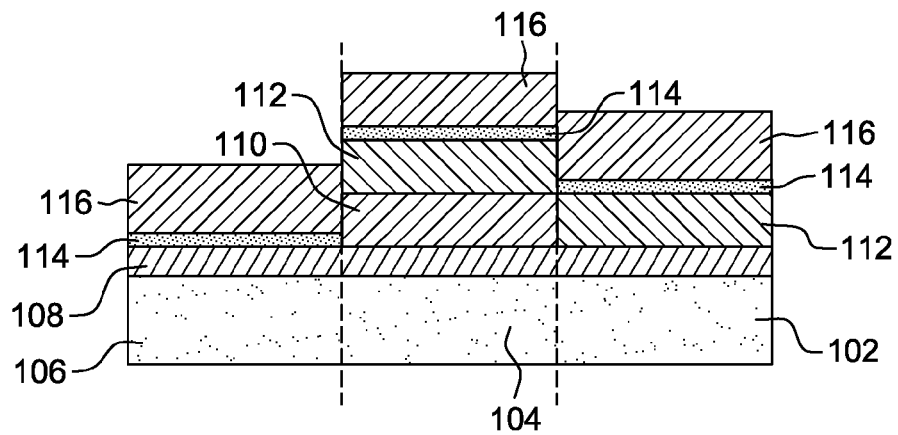
Figure 5:
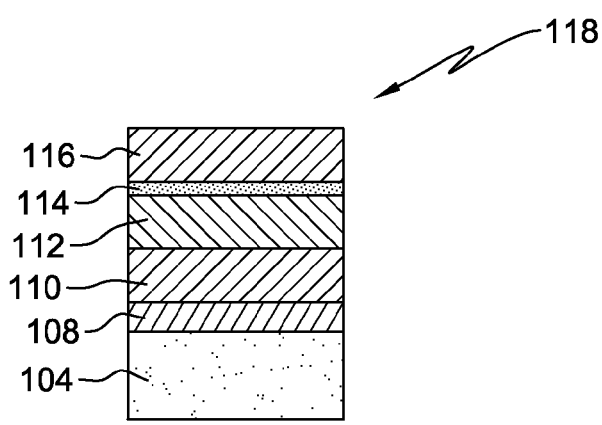
FIG. 5 depicts one example of a finished midgap semiconductor device according to aspects of the present invention.

As depicted by FIG. 4, a barrier layer 114, which prevents layer interaction, may be deposited over the second work function layer 112 above the midgap and PFET devices, as well as over the exposed dielectric layer 108 above the NFET. The barrier layer preferably comprises a nitride, for example, TiN or TaN, and is deposited to a thickness of, for example, about 10 Angstroms using a suitable deposition process, such as ALD, PVD, CVD or the like. Above the barrier layer is deposited a layer of n-type metal 116, for example, TiAlC, TaAlC, TiAl, TaAl, HfAlC, HfAl, Al and Ti, having a thickness of about 30 Angstroms to about 70 Angstroms by a suitable deposition process, such as those previously described. FIG. 5 shows the finished midgap device 118 with the inventive gate structure.

While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method of fabricating a midgap semiconductor device, the method comprising:
   providing a p-type semiconductor device;
   creating an annealed first work function layer over only the p-type semiconductor device, wherein the first work function layer comprises a transition metal nitride;
   creating an unannealed second work function layer over the annealed first work function layer, wherein the second work function layer comprises a transition metal nitride;

creating a barrier layer over the second work-function layer;

creating n-type metal over the barrier layer, wherein the p-type semiconductor device, the annealed first work function layer, the second work function layer, the barrier layer and the n-type metal together form a midgap semiconductor device, the midgap semiconductor device having a work-function between that of an n-type device and a p-type device;

wherein the p-type semiconductor device comprises a p-type field-effect transistor (PFET); and wherein the first work function layer and the second work function layer comprise TiN, and wherein the barrier layer has a thickness of about 10 Angstroms, the n-type metal has a thickness of about 30 Angstroms to about 70 Angstroms, the second layer of TiN has a thickness of about 20 Angstroms to about 50 Angstroms, and the layer of annealed TiN has a thickness of about 30 Angstroms to about 60 Angstroms.

2. A method of fabricating a midgap semiconductor device, the method comprising:

providing a p-type semiconductor device;

creating an annealed first work function layer over only the p-type semiconductor device, wherein the first work function layer comprises a transition metal nitride;

creating an unannealed second work function layer over the annealed first work function layer, wherein the second work function layer comprises a transition metal nitride;

creating a barrier layer over the second work-function layer;

creating n-type metal over the barrier layer, wherein the p-type semiconductor device, the annealed first work function layer, the second work function layer, the barrier layer and the n-type metal together form a midgap semiconductor device, the midgap semiconductor device having a work-function between that of an n-type device and a p-type device;

wherein the p-type semiconductor device comprises a p-type field-effect transistor (PFET), and wherein the first work function layer and the second work function layer comprise TiN, and wherein the barrier layer has a thickness of about 10 Angstroms, the n-type metal has a thickness of about 30 Angstroms to about 70 Angstroms, the second layer of TiN has a thickness of about 20 Angstroms to about 50 Angstroms, and the layer of annealed TiN has a thickness of about 30 Angstroms to about 60 Angstroms, and wherein: the dielectric layer comprises one of $HfO_2$, $HfSiO_x$ and $HfLaO_x$; the n-type metal comprises one of TiAlC, TaAlC, TiAl, TaAl, HfAlC, HfAl, Al and Ti; and the barrier layer comprises one of TiN and TaN.

* * * * *